United States Patent
Arif et al.

(10) Patent No.: US 11,699,650 B2
(45) Date of Patent: Jul. 11, 2023

(54) INTEGRATED CIRCUIT STRUCTURE WITH CAPACITOR ELECTRODES IN DIFFERENT ILD LAYERS, AND RELATED METHODS

(71) Applicant: GLOBALFOUNDRIES U.S. Inc., Santa Clara, CA (US)

(72) Inventors: Alamgir M. Arif, Saratoga Springs, NY (US); Sunil K. Singh, Mechanicville, NY (US); Dewei Xu, Clifton Park, NY (US); Seung-Yeop Kook, Mechanicville, NY (US); Roderick A. Augur, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 79 days.

(21) Appl. No.: 17/151,346

(22) Filed: Jan. 18, 2021

(65) Prior Publication Data

US 2022/0230955 A1    Jul. 21, 2022

(51) Int. Cl.
*H01L 23/522* (2006.01)
*H01L 49/02* (2006.01)

(52) U.S. Cl.
CPC ...... *H01L 23/5223* (2013.01); *H01L 23/5226* (2013.01); *H01L 28/60* (2013.01)

(58) Field of Classification Search
CPC .. H01L 23/5223; H01L 23/5226; H01L 28/60
USPC ..................................................... 257/532
See application file for complete search history.

(56) References Cited

U.S. PATENT DOCUMENTS

| | | | |
|---|---|---|---|
| 5,999,010 A | 12/1999 | Arora et al. | |
| 6,061,508 A | 5/2000 | Mehrotra et al. | |
| 6,271,082 B1 | 8/2001 | Hou et al. | |
| 6,830,971 B2 * | 12/2004 | Balakumar | H01L 28/56 257/E21.018 |
| 6,885,056 B1 | 4/2005 | Dornisch et al. | |
| 7,089,516 B2 | 8/2006 | Arora et al. | |
| 7,538,006 B1 | 5/2009 | Anderson et al. | |
| 7,900,164 B1 | 3/2011 | Chen et al. | |
| 9,698,213 B1 | 7/2017 | Yang | |

(Continued)

FOREIGN PATENT DOCUMENTS

| | | |
|---|---|---|
| DE | 102011052914 A1 | 3/2012 |
| DE | 102016100272 A1 | 4/2017 |

OTHER PUBLICATIONS

U.S. Appl. No. 16/408,536, Office Action dated Oct. 14, 2020, 21 pages.

(Continued)

*Primary Examiner* — Tu-Tu V Ho
(74) *Attorney, Agent, or Firm* — Anthony Canale; Hoffman Warnick LLC

(57) ABSTRACT

Embodiments of the disclosure provide an integrated circuit (IC) structure. With capacitor electrodes in different ILD layers. The structure includes a first inter-level dielectric (ILD) layer having a top surface, a first vertical electrode within the first ILD layer, a capacitor dielectric film on a top surface of the first vertical electrode, a second ILD layer over the first ILD layer, and a second vertical electrode within the second ILD layer and on the capacitor dielectric film. The capacitor dielectric film is vertically between the first vertical electrode and the second vertical electrode.

19 Claims, 21 Drawing Sheets

(56) References Cited

U.S. PATENT DOCUMENTS

| | | |
|---|---|---|
| 9,847,481 B2 | 12/2017 | Chang et al. |
| 9,985,089 B2 | 5/2018 | Yang |
| 2004/0087101 A1 | 5/2004 | Balakumar et al. |
| 2005/0110143 A1 | 5/2005 | Ahn et al. |
| 2006/0071262 A1 | 4/2006 | Wang |
| 2007/0173012 A1 | 7/2007 | Aoki |
| 2010/0090308 A1* | 4/2010 | Sardana .......... H01L 28/91 257/532 |
| 2010/0164063 A1 | 7/2010 | Yun |
| 2011/0018099 A1 | 1/2011 | Muramatsu |
| 2012/0057270 A1 | 3/2012 | Foerster |
| 2012/0091519 A1 | 4/2012 | Tu |
| 2012/0119326 A1 | 5/2012 | Sugisaki et al. |
| 2013/0307158 A1 | 11/2013 | Anderson et al. |
| 2014/0159200 A1 | 6/2014 | Loke et al. |
| 2018/0158617 A1 | 6/2018 | Carver et al. |
| 2020/0058731 A1 | 2/2020 | Mun et al. |
| 2020/0411525 A1* | 12/2020 | Lajoie .......... H01L 27/1225 |

OTHER PUBLICATIONS

U.S. Appl. No. 16/408,536, Notice of Allowance dated Jan. 13, 2021, 9 pages.
U.S. Appl. No. 17/089,775, Office Action dated Jan. 5, 2022, 27 pages.
U.S. Appl. No. 17/089,775, Notice of Allowance dated Mar. 7, 2022, 23 pages.

* cited by examiner

INTEGRATED CIRCUIT STRUCTURE WITH CAPACITOR ELECTRODES IN DIFFERENT ILD LAYERS, AND RELATED METHODS

BACKGROUND

The present disclosure relates to integrated circuits (ICs), and more specifically, to an IC structure with capacitor electrodes in multiple wiring levels, and related methods to form the IC structure.

Capacitor structures in an IC conventionally include two metal plates with an insulator between the plates. The plates may occupy at least a minimum surface area to achieve desired capacitances. One conventional approach for integrating capacitors into an integrated circuit is to form transverse metal lines, or "fingers," extending outward from a larger wire. The fingers interdigitate with the transverse metal lines of a nearby wire. However, such a configuration may impose limits on manufacturability and capacitance ranges as devices continue to decrease in size. Such limits on the size of a capacitor are of particular concern when a product specification requires an ultra-low capacitor, i.e., capacitors with no more than approximately 0.5 femtofarads (fF).

Conventional approaches for providing ultra-low capacitance have included, e.g., increasing the space between alternating horizontal electrodes to reduce the capacitance density in the capacitor structure. Alternate approaches have included serially connecting larger capacitors together to reduce the effective capacitance between two nodes. These and other approaches, however, have produced significant uncertainty and error in the actual capacitance of a device.

SUMMARY

Aspects of the disclosure provide an integrated circuit (IC) structure, including: a first inter-level dielectric (ILD) layer having a top surface; a first vertical electrode within the first ILD layer; a capacitor dielectric film on a top surface of the first vertical electrode; a second ILD layer over the first ILD layer; and a second vertical electrode within the second ILD layer and on the capacitor dielectric film, wherein capacitor dielectric film is vertically between the first vertical electrode and the second vertical electrode.

Further aspects of the disclosure provide a structure, including: a first metal wiring level including: a first inter-level dielectric (ILD) layer having a top surface, and a first rounded electrode within the first ILD layer, and having a top surface substantially coplanar with the top surface of the first ILD layer; a barrier film on the top surface of the first ILD layer of the first metal wiring level; and a second metal wiring level including: a capacitor dielectric film on the top surface of the first rounded electrode, and horizontally adjacent the barrier film, a second ILD layer on a first portion of the barrier film, a first via within the second ILD layer, and horizontally distal to the capacitor dielectric film, and a second rounded electrode within the second ILD layer and on a second portion of the barrier film, wherein the second rounded electrode is horizontally distal to the first via in the second ILD layer, and the second portion of the barrier film defines a capacitor dielectric region vertically between the first rounded electrode and the second rounded electrode.

Additional aspects of the disclosure provide a method of forming an integrated circuit (IC) structure, the method including: forming a first metal wiring level including a first rounded electrode within a first inter-level dielectric (ILD) layer, wherein a top surface of the first rounded electrode is substantially coplanar with a top surface of the first ILD layer; forming a capacitor dielectric film on a top surface of the first rounded electrode; forming a metal wiring level including a second ILD layer over the first ILD layer; forming a second rounded electrode within the second ILD layer of the second metal wiring level over the capacitor dielectric film, wherein forming the second rounded electrode causes the capacitor dielectric film to be vertically between the first rounded electrode and the second rounded electrode; and forming a via within the second ILD layer of the second metal wiring level, wherein the via is horizontally distal to the capacitor dielectric film and the second rounded electrode.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
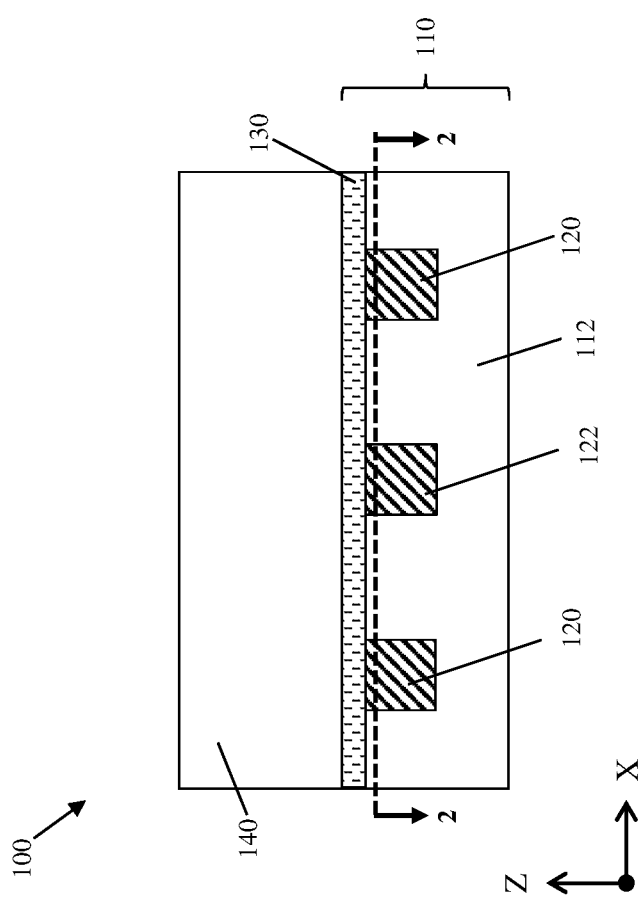
FIG. 1 shows a cross-sectional view of a preliminary structure with a first metal wiring level with conductive wires and a first rounded electrode according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an IC structure with capacitor electrodes formed in multiple wiring levels, and related methods to form such a structure. A first metal wiring level of the structure may include a first layer of inter-level dielectric (ILD) material, and a first rounded electrode with a top surface that is substantially coplanar with the top of the first layer of ILD material. Although the first rounded electrode is within the first metal wiring level, other portions of the capacitor structure may be formed in an overlying metal level. A barrier film is on the top surface of the ILD material, with a second metal wiring level being over the barrier film. The second metal wiring level may include a capacitor dielectric film on the first rounded electrode. In some cases, a portion of the barrier film defines the capacitor dielectric film. A second ILD layer is on the barrier film. A second rounded electrode is within the second ILD layer and on the capacitor dielectric film, with the capacitor dielectric film being vertically between the two rounded electrodes. A first via is within the second ILD, horizontally distal to the capacitor dielectric film, or the portion of the barrier film that defines the capacitor dielectric film. Methods to form such structures are also described.

FIG. 1 shows a cross-sectional view in plane X-Z of a preliminary structure 100 to be processed according to embodiments of the disclosure. Preliminary structure 100 as shown in FIG. 1 provides one initial set of materials targeted for use with embodiments of the disclosure, but it is understood that embodiments of the disclosure may be implemented on different designs without significant changes to the various example techniques discussed herein.

Preliminary structure 100 may represent a portion of a first metal wiring level 110 including various insulative and/or conductive materials. First metal wiring level 110 may be positioned on (i.e., directly or indirectly) or otherwise above a device layer (not shown) including electrical devices such as transistors, diodes, resistors, capacitors, inductors, etc., for providing operational features of a device. The composition and function of a device layer is generally known in the art, and not shown in the accompanying FIGS., or discussed in further detail herein.

First metal wiring level 110 may be formed of a first inter-level dielectric (ILD) layer 112, e.g., one or more oxide-based dielectric materials suitable to physically and electrically separate respective regions of conductive material in wiring level 110. Other types of oxide-based or nitride-based dielectric materials may also be appropriate for distinguishing from other dielectric materials, as discussed elsewhere herein. First ILD layer 112 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Portions of first metal wiring level 110 may include a set of first level conductors 120 (e.g., one or more metal wires, two of such wires being shown in FIG. 1) for electrically coupling portions of first metal wiring level 110 to other wiring levels and/or other portions of a device layer. First level conductor(s) 120 may include any currently known or later developed conductive substance capable of forming a conductive pathway between multiple electrically active elements. As examples, first level conductor(s) 120 may include any and/or all conductive materials such as copper (Cu), aluminum (Al), tungsten (W), cobalt (Co), titanium (Ti), etc. Though not shown in the accompanying FIGS., a barrier liner may also be deposited on the sidewalls of insulative material adjacent first level conductor 120, and may precede first level conductor 120 formation. The deposited barrier liner may include any now known or later developed barrier liner material (e.g., refractory metal liner) including but not limited to: tantalum nitride (TaN) and tantalum; tantalum nitride, tantalum and cobalt; and magnesium (Mn), or combinations thereof. Similar liners may also be formed on sidewalls of other conductive materials described herein. First level conductor 120 may be formed, e.g., by deposition of conductive materials within trenches of wiring level 110, and/or by patterning of wiring level 110 and/or first level conductor 120 material.

Two first level conductors 120 are shown in first metal wiring level 110 as an example, though this is not necessarily the case in all implementations. First level conductors 120 may be formed, e.g., by deposition. Forming a material by "depositing" or "deposition" generally may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, spin-on methods, physical vapor deposition (PVD), atomic layer deposition (ALD), molecular beam epitaxy (MBE), plating, evaporation.

Figure 2:
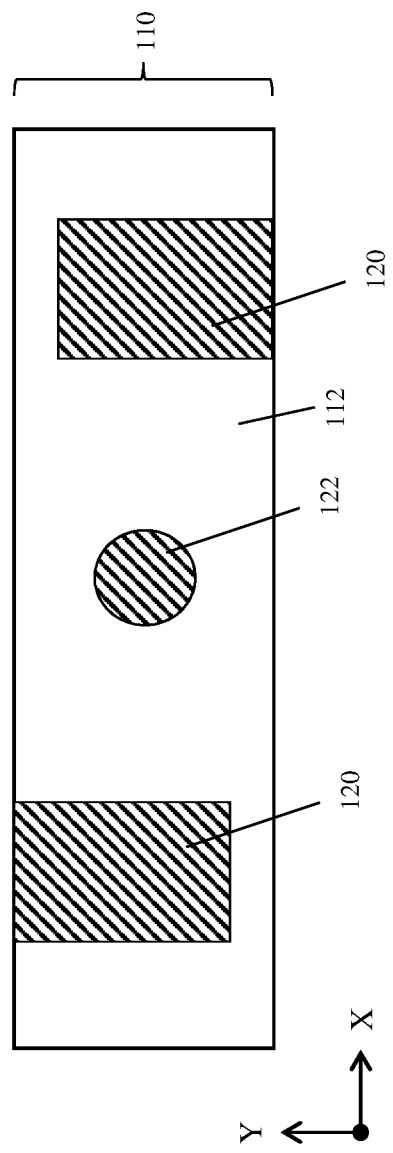
FIG. 2 shows a plan view from view line 2-2 of FIG. 1 of a preliminary structure with conductive wires and a first rounded electrode according to embodiments of the disclosure.

Referring to FIGS. 1 and 2 together, first metal wiring level 110 may include a first rounded electrode 122 within first ILD layer 112, and adjacent first level conductors 120. The example X-Y geometrical profile of first rounded electrode 122 in FIG. 2 is circular, but other rounded geometries (e.g., ovular shapes, partially rounded shapes, etc.) are also possible. First rounded electrode 122 thus may be rounded laterally with respect to its horizontal cross-section. For instance, first rounded electrode 122 may take the form of a right cylinder, elliptical cylinder, and/or substantially rounded shapes, which may include rounded and/or non-rounded corners in various configurations. The rounded portions of first rounded electrode 122 may include horizontally rounded portions, and/or other rounded features along its upper and/or lower surfaces. The plan view in FIG. 2 of first metal wiring level 110, taken along view line 2-2 of FIG. 1, illustrates that first rounded electrode 122 has a rounded geometry in plane X-Y, as compared with conventional wiring structures (e.g., first level conductor(s) 120) with non-rounded geometries. First rounded electrode 122 otherwise may include the same material or similar materials to those in first level conductor(s) 120, and may be formed concurrently with first level conductor(s) 120 in first ILD layer 112, e.g., by deposition, planarization, etc., with the aid of a mask having a rounded opening used to form first rounded electrode 122. FIG. 2 depicts first level conductors 120 as being horizontally coupled to and/or including other conductive materials that extend in the Y-axis direction, though this is not necessarily true in all implementations. First rounded electrode 122, additionally, may be electrically coupled to other components (e.g., various metal wires or vias) located beneath the FIG. 2 cross-section. First rounded electrode 122 may be one of two opposite polarity electrodes in a capacitor within an IC according to embodiments of the disclosure. Processes to form other portions of the capacitor in wiring levels other than first metal wiring level 110 are described elsewhere herein.

Returning to FIG. 1, first metal wiring layer 110 of preliminary structure 100 may include, e.g., a barrier film 130 for vertically isolating overlying materials from first metal wiring level 110 thereunder. Barrier film 130 may include one or more electrically insulative materials with a particularly high resistance to etching. Barrier film 130 more specifically may be formed as an "etch stop layer," configured to prevent underlying device components from being removed or modified in subsequent processing. Barrier film 130 thus may include, e.g., an oxygen-doped silicon carbide (SiC:O) layer, a nitrogen-doped silicon carbide (SiC:N) layer, or other material with similar properties. Preliminary structure 100 may also include a second ILD layer 140 on barrier film 130. Second ILD layer 140 may include one or more insulative materials included within first ILD layer 112 of first metal wiring level 110, and/or may include any other currently known or later developed insulative material. Second ILD layer 140 may be the initial layer of material to form a second metal wiring level over first metal wiring level 110, and barrier film 130.

Figure 3:
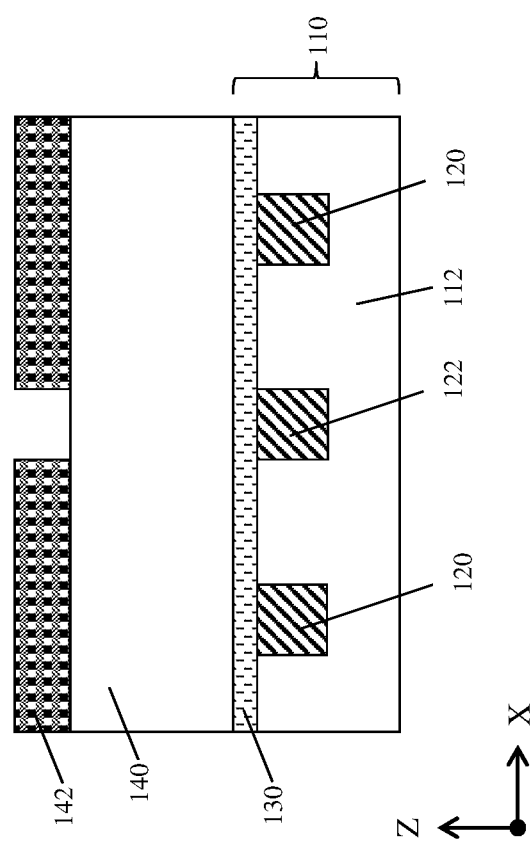
FIG. 3 shows a cross-sectional view of forming an electrode mask on the preliminary structure according to embodiments of the disclosure.
Figure 4:
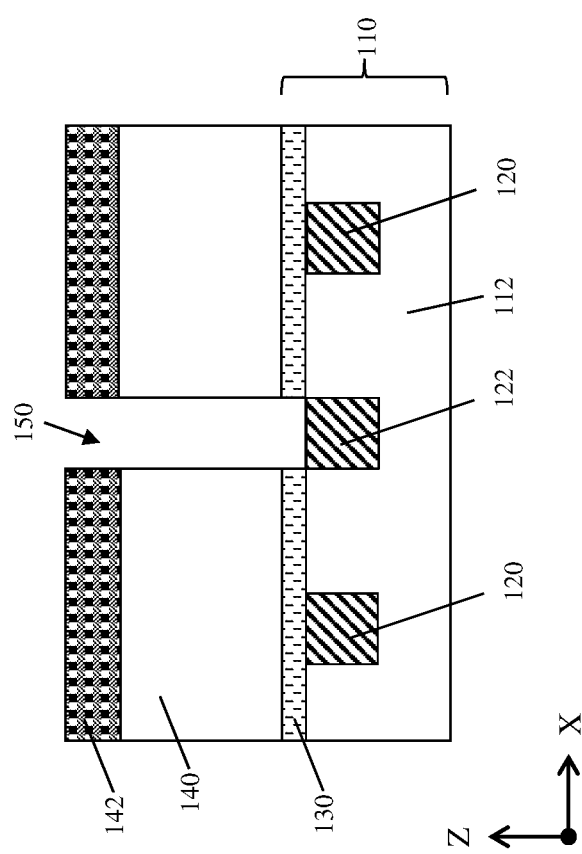
FIG. 4 shows a cross-sectional view of forming an electrode opening to the first metal wiring level according to embodiments of the disclosure.

Referring now to FIGS. 3 and 4, methods according to the disclosure may include removing selected portions of barrier film 130 and second ILD layer 140, for replacement with the remaining portions of a capacitor. Reactive ion etching (RIE) with a mask 142 (FIG. 3) in place on second ILD layer 140 is one technique suitable to form first opening(s) 150 (FIG. 4) where dielectric and conductive materials for a capacitor may be formed. First opening(s) 150 may have a rounded shape, which may similar to or different in size, horizontal area, etc., with respect to first rounded electrode 122. However, mask 142 may be structured such that first opening(s) 150 is/are at least partially over, and thus substantially vertically aligned with, first rounded electrode 122. Although first opening(s) 150 may be different in shape or size as compared with first rounded electrode 122, a top surface of first rounded electrode 122 may be exposed in first opening(s) 150 such that overlying conductive materials may be formed thereon.

First opening(s) 150 may be formed by etching and/or any currently known or later developed process to remove portions of a material. Etching generally refers to the removal of material from a substrate (or structures formed on the substrate), and is often performed with patterned materials such as mask 142 in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases, which approach the wafer approximately from one direction, and therefore this process is highly anisotropic. Reactive-ion etching (RIE) operates under conditions intermediate between sputter and plasma etching and may be used to produce deep, narrow features suitable to create similar elements, e.g., vertically extending rounded electrodes as discussed herein. The forming of first opening(s) 150 may also remove underlying portions of barrier film 130, either by continued etching and/or by a different etching phase, to expose first rounded electrode 122 of first metal wiring level 110.

Figure 5:
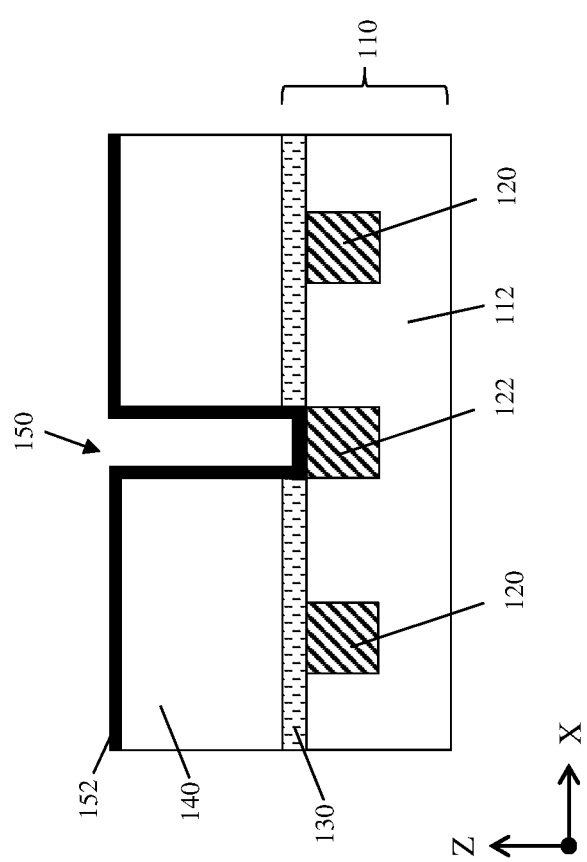
FIG. 5 shows a cross-sectional view of forming a capacitor dielectric film in the electrode opening according to embodiments of the disclosure.

Turning to FIG. 5, methods according to the disclosure may include forming a dielectric layer 152 within first opening 150. Dielectric layer 152 may include a hafnium-based dielectric material such as, e.g., hafnium oxide ($HfO_2$), or metal silicates such as hafnium silicate oxide ($Hf_{A1}Si_{A2}O_{A3}$), and/or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Hafnium-based dielectric materials may be preferable due to, e.g., their ability to be conformally deposited and/or their effectiveness in a capacitor. Dielectric layer alternatively may include a high-k dielectric, such as, but not limited to: metal oxides tantalum oxide ($Ta_2O_5$), barium titanium oxide ($BaTiO_3$), zirconium oxide ($ZrO_2$), aluminum oxide ($Al_2O_3$), etc. Dielectric layer 152 may include any conceivable insulating material, such as, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) $[(CH_3)_2SiO]_4$ 2.7 available from Air Liquide, etc., or other low dielectric constant (k<3.9) material, or combinations thereof. Dielectric layer 152 may also include high-k dielectric materials, such as, but not limited to, hafnium silicate (HfSiO), zirconium silicate ($ZrSiO_x$), silicon oxynitride (SiON), or any combination of these materials.

Dielectric layer 152 may be formed, e.g., by conformal deposition such that portions of dielectric layer 152 are in contact with upper portions of second ILD layer 140, sidewalls of first opening 150, and the top surface of first rounded electrode 122. The forming of dielectric layer 152 may be controlled, such that a thickness of dielectric layer 152 is between approximately five nanometers (nm) to approximately fifteen nm. Portions of first opening 150 may remain unfilled after dielectric layer 152 is formed, in cases where dielectric layer 152 is formed by conformal deposition. Regardless of the shape of first opening 150, a bottom surface of dielectric layer 152 may be in physical contact with the top surface of first rounded electrode 122, and horizontally adjacent barrier film 130.

Figure 6:
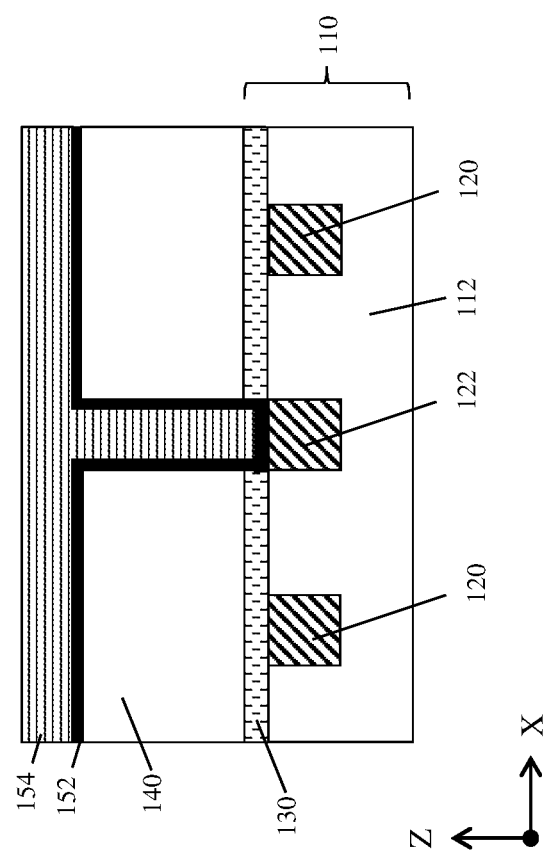
FIG. 6 shows a cross-sectional view of forming a second electrode material in the electrode opening according to embodiments of the disclosure.

FIG. 6 depicts the forming of additional conductive materials for use in a capacitor structure. Methods according to the disclosure may include depositing a conductor layer 154 within first opening 150 (FIGS. 4, 5) and over second ILD layer 140. Conductor layer 154 may include a conductive metal that is different from first rounded electrode 122. For instance, conductor layer 154 may include tungsten (W), or alternatively, other refractory and/or any other currently known or later developed material suitable for use as a capacitor electrode, e.g., aluminum (Al), tantalum (Ta), silver (Ag), etc. In further implementations discussed elsewhere herein, conductor layer 154 may include the same metal and/or similar metals to first rounded electrode 122, e.g., copper. Conductor layer 154 may be formed by deposition, such that conductor layer 154 fills first opening 150 (FIGS. 4, 5) and overlies dielectric layer 152 above second ILD layer 140. Portions of conductor layer 154 formed within first opening 150 may have a rounded cross-section, in cases where the shape of mask 148 causes first opening 150 to have a rounded shape. Thus, portions of conductor layer 154 within first opening 150 may be horizontally surrounded by the previously-formed dielectric layer 152, and a portion of dielectric layer 152 vertically separates conductor layer 154 from first rounded electrode 122 thereunder.

Figure 7:
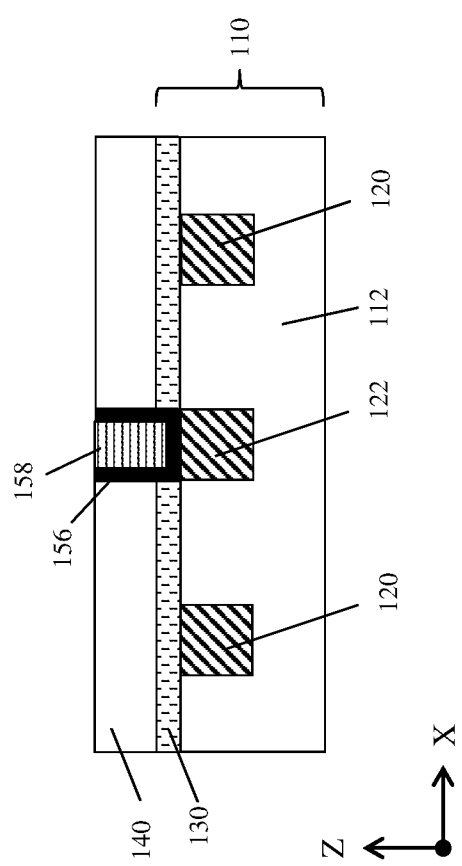
FIG. 7 shows a cross-sectional view of forming a second rounded electrode according to embodiments of the disclosure.
Figure 10:
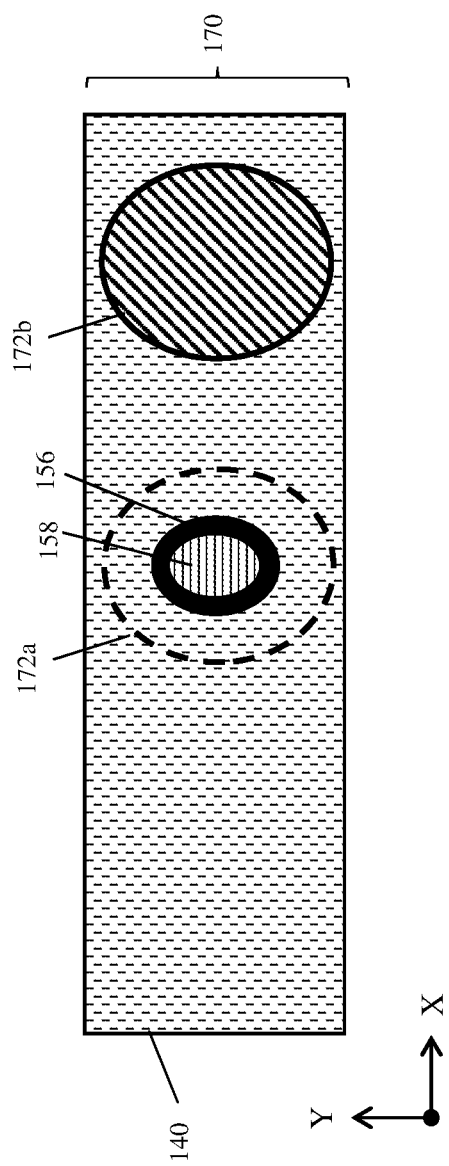
FIG. 10 shows a plan view from view line 10-10 of FIG. 9 of a conductive wire and a second rounded electrode according to embodiments of the disclosure.

Turning now to FIG. 7, further processing according to the disclosure may include planarizing of second ILD layer 140, dielectric layer 152 (FIGS. 5, 6) and conductor layer 154 (FIG. 6) to a desired height above first metal wiring level 110. The planarizing may be implemented by way of, e.g., chemical mechanical planarization (CMP), etching, and/or other processes capable of removing second ILD layer 140, dielectric layer 152, and conductor layer 154 at the same rate of removal. Remaining portions of dielectric layer 152 may become a capacitor dielectric film 156. Remaining portions of conductor layer 154 may form a second rounded electrode 158 on capacitor dielectric film 156. The example X-Y geometrical profile of second rounded electrode 158 shown in FIG. 10 is circular, but other rounded geometries (e.g., ovular shapes, partially rounded shapes, etc.) are also possible. Second rounded electrode 158 thus may be rounded laterally with respect to its horizontal cross-section. For instance, second rounded electrode 158 may take the form of a right cylinder, elliptical cylinder, and/or substantially rounded shapes, which may include rounded and/or non-rounded corners in various configurations. The rounded portions of first rounded electrode 158 may include horizontally rounded portions, and/or other rounded features along its upper and/or lower surfaces. Second rounded electrode 158, however shaped, may be substantially vertically aligned with first rounded electrode 122. A portion of capacitor dielectric film 156 may vertically separate first rounded electrode 122 and second rounded electrode 158, despite each rounded electrode 122, 158 being in vertical alignment with the other. Further portions of capacitor dielectric film may horizontally surround second rounded electrode 158, and thus are positioned alongside barrier film 130 or second ILD layer 140.

Figure 8:
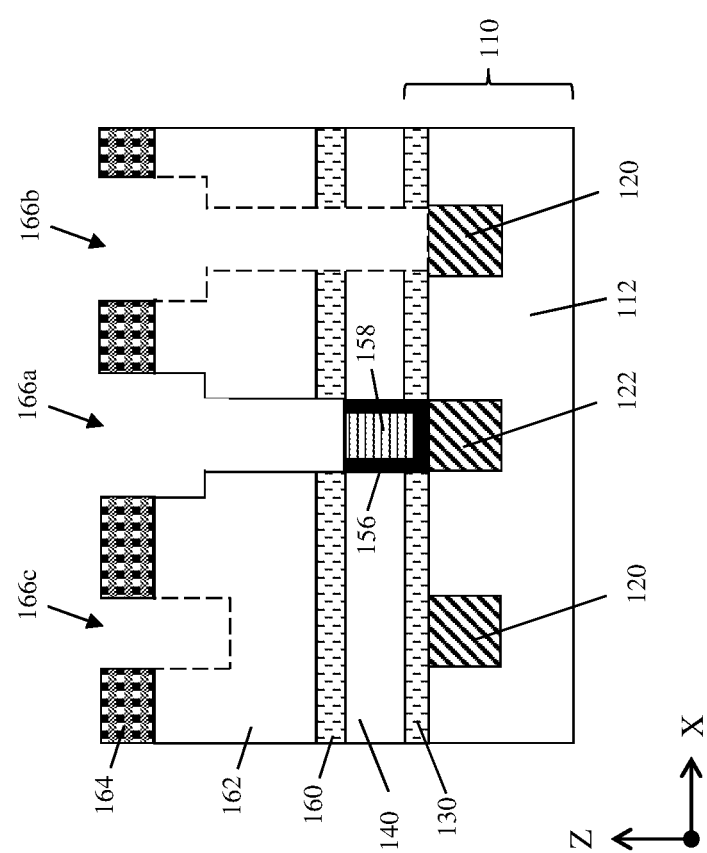
FIG. 8 shows a cross-sectional view of forming a second ILD layer and wiring openings according to embodiments of the disclosure.

FIG. 8 depicts processes to begin forming the remaining portions of another (e.g., second) metal wiring level. The additional metal wiring layer may be over second ILD layer 140, capacitor dielectric film 156, and second rounded electrode 158. In other locations, the components of the next wiring level may be formed substantially in accordance with conventional processing for metal wiring levels. With capacitor dielectric film 156 and second rounded electrode 158 in place, continued processing may include forming an additional barrier film 160 over second ILD layer 140 to cover capacitor dielectric film 156 and second rounded electrode 158. An additional portion of second ILD layer (simply "additional portion" hereafter) 162 can then be formed over additional barrier film 160, with each barrier film 130, 160, second ILD layer 140 (with additional portion 162 where applicable) defining the materials for another metal wiring level. In some implementations, additional barrier film 160 may be omitted, and additional portion 162 may be omitted or otherwise structurally integral with second ILD layer 140.

A set of masks 164 can be formed atop additional portion 162 140, with openings therein to define targeted locations for wires and vias in the next metal wiring layer. Each mask 164 can be structured to form one of a set of second openings 166a, 166b, 166c within barrier film 130, second ILD layer 140, additional barrier film 160, and additional portion 162 thereunder. Some of second openings 166b, 166c are illustrated with dashed lines to indicate that they may be formed separately from second opening 166a, and/or using other masks 164. One type of second opening 166a can expose capacitor dielectric film 156 and second rounded electrode 158 thereunder. Another type of second opening 166*b* may extend to first level conductor(s) 120. Yet another type of second opening 166*c* may extend only partially into second ILD layer 140. Each type of second opening 166*a*, 166*b*, 166*c* can be structured to form respective components therein, e.g., different types of metal wires and/or vias.

Figure 9:
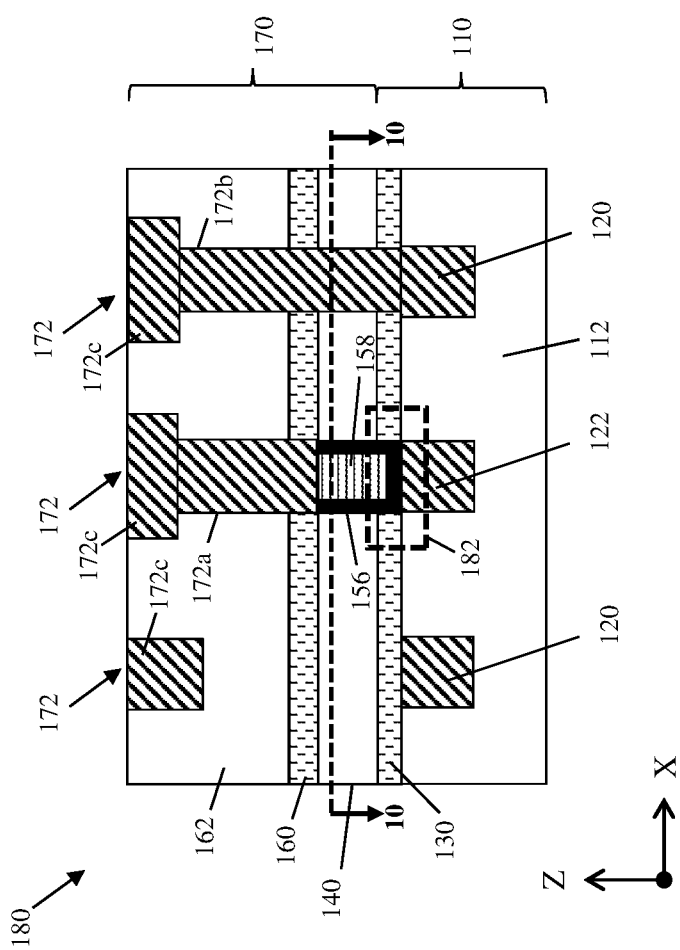
FIG. 9 shows a cross-sectional view of forming conductive material for a second metal wiring level according to embodiments of the disclosure.

Referring now to FIGS. 9 and 10, methods according to the disclosure may include filling second opening(s) 166*a*, 166*b*, 166*c* (FIG. 8) to form a second metal wiring level 170 over first metal wiring level 110. Methods according to the disclosure may include, e.g., forming one or more second level conductors 172 within respective second opening(s) 116*a*, 116*b*, 116*c*. One type of second level conductor 172 may be a via 172*a*, defining a vertical conductive pathway to second rounded electrode 158. Another type of second level conductor 172 may be a via 172*b*, vertically coupling portions of second metal wiring level 170 to first level conductor(s) 120 thereunder. Via 172*b* may be horizontally displaced from via 172*a* as well as first rounded electrode 122, capacitor dielectric film 156, and second rounded electrode 158. Another type of second level conductor 172 may be a wire 172*c* for horizontal coupling of electrically active elements. Some wires 172*c* simply may extend horizontally through second metal wiring level 170, and thus are positioned vertically above and electrically disconnected from first level conductor(s) 120 thereunder. In further examples, some wires 172*c* may be electrically coupled to via(s) 172*a*, 172*b* by being positioned on upper surfaces thereof. Thus, one or more wire(s) 172*c* may connect to second rounded electrode 158 through via(s) 172*a*, and without intervening conductive elements. Although second opening(s) 166*a*, 166*b*, 166*c* may be formed separately from each other using different masks 164, each opening 166*a*, 166*b*, 166*c* may be filled with second level conductor 172 simultaneously.

Second level conductor(s) 172 may include any currently known or later developed conductive material, e.g., any of those discussed herein with respect to first level conductor(s) 120. Second level conductor(s) 172 may include, e.g., metal wires and/or vias for electrically coupling metal wiring levels 110, 170 to each other, and to other portions of a device, where applicable. The forming of second level conductor(s) 172 may be implemented, e.g., by deposition of conductive material, and subsequent planarization. Though not shown in the accompanying FIGS., a barrier liner may also be deposited on the sidewalls of second opening(s) 166*a*, 166*b*, 166*c*, and may precede second level conductor 172 formation, e.g., as mentioned elsewhere herein. In some cases, second level conductor(s) 172 may be formed by a damascene process. Damascene is a process in which an interconnect pattern is first lithographically defined in a layer of dielectric, then metal is deposited to fill resulting wire trench openings or via openings, and then excess metal is removed by means of chemical-mechanical polishing (planarization). Dual damascene is a similar process in which interconnect patterns define wire trench openings and via openings together (e.g., as may be the case in second opening(s) 166*a*, 166*b*, 166*c* before metal deposition). The conductive materials also may be planarized (e.g., by chemical mechanical planarization (CMP) or similar processes) such that they are coplanar with the top surface of second metal wiring level 170.

Referring to FIGS. 9 and 10 together, second metal wiring level 170 may include second rounded electrode 158 within second ILD layer 140, and adjacent one or more second level conductors 172. The plan view of second metal wiring level 170 in FIG. 10, taken along view line 10-10 of FIG. 9, illustrates that capacitor dielectric film 156 and second rounded electrode 158 have a rounded geometry in plane X-Y, as compared with conventional wiring structures. The location of via 172*a* above second rounded electrode 158 is shown with dashed lines, to emphasize its vertical alignment with via 172*a*, and its distinct cross-sectional area. FIG. 10 depicts a portion of via 172 as being horizontally coupled to and/or including other conductive materials that extend in the Y-axis direction, though this is not necessarily true in all implementations.

Figure 11:
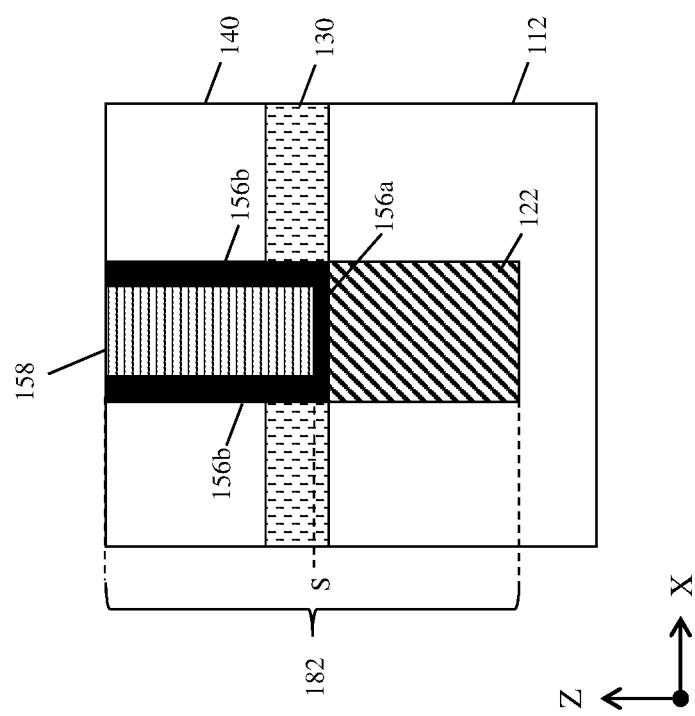
FIG. 11 shows an expanded cross-sectional view of a capacitor structure according to embodiments of the disclosure.

Referring now to FIGS. 9 and 11, embodiments of the disclosure provide an IC structure 180 with a capacitor 182 between first metal wiring level 110 and second metal wiring level 170. FIG. 11 provides an expanded view of capacitor 182 to better illustrate subcomponents thereof. Capacitor 182 of IC structure 180 may include, e.g., first rounded electrode 122 below and at least partially vertically aligned with second rounded electrode 158. Capacitor dielectric film 156 is vertically between first rounded electrode 122 and second rounded electrode 158, and thus separates first rounded electrode 122 from second rounded electrode 158. Additionally, a bottom surface S (FIG. 11) of second rounded electrode 158 may be below a lower surface of second ILD layer 140, such that a portion of second rounded electrode 158 protrudes downwardly from second metal wiring layer 170 into first metal wiring layer 110, alongside a portion of barrier film 130.

As shown in FIG. 11, capacitor dielectric film 156 may include a horizontally extending first portion 156*a* and a vertically extending second portion 156*b*. First portion 156*a* may be the portion of capacitor dielectric film 156 on a top surface of first rounded electrode 122, and below the bottom surface of second rounded electrode 158. Second portion 156*b*, however, may be the portion of capacitor dielectric film 156 that circumferentially surrounds and abuts sidewalls of second rounded electrode 158. Second portion 156*b* may also abut portions of barrier film 130, second ILD layer 140, and/or other layers formed thereon. Thus, capacitor 182 is positioned partially within first metal wiring level 110 (e.g., through first rounded electrode 122) and second metal wiring level 170 (e.g., through capacitor dielectric film 156 and second rounded electrode 158). As shown in FIG. 9, via 172*a* of second metal wiring level 170 may be positioned over, and vertically coupled to, capacitor 182 while another via 172*b* may be horizontally distal to capacitor 182 within first metal wiring level 110 and/or second metal wiring level 170.

Figure 12:
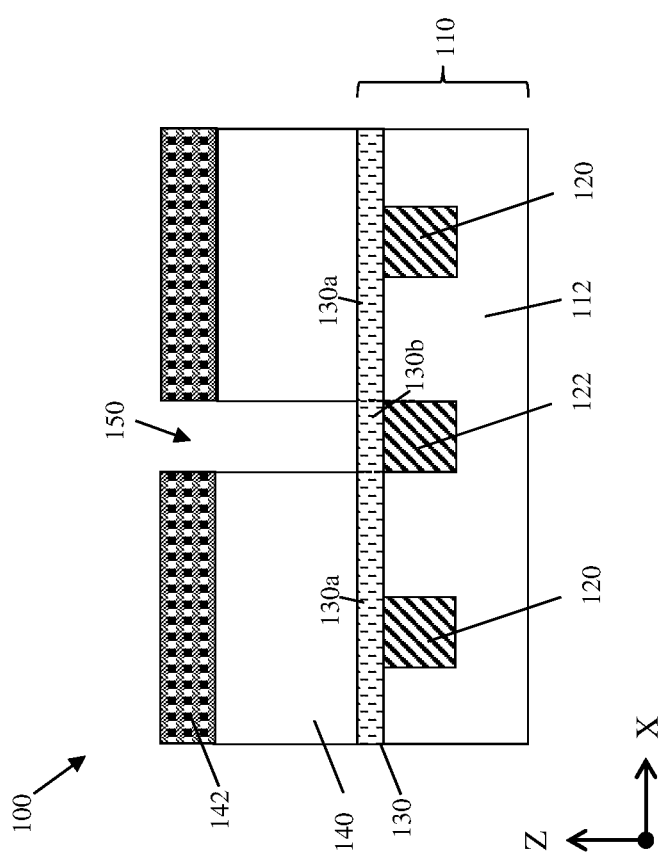
FIG. 12 shows a cross-sectional view of forming an electrode opening to a barrier film on the first metal wiring level according to further embodiments of the disclosure.
Figure 13:
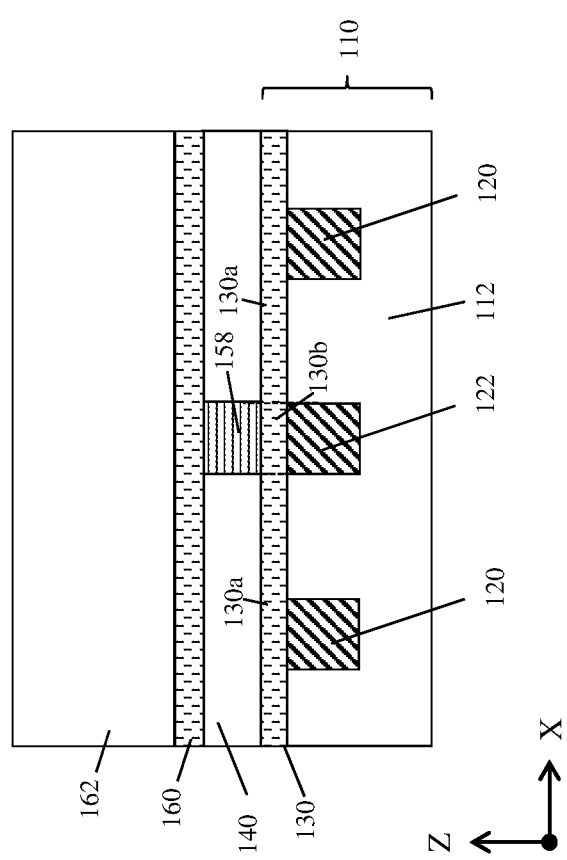
FIG. 13 shows a cross-sectional view of forming a second rounded electrode on the barrier film according to further embodiments of the disclosure.

Referring now to FIGS. 12-15, further methodologies according to the disclosure are operable to form IC structure 180 (FIG. 15 only), in which a portion of barrier film 130 acts as a capacitor dielectric material. The various additional and/or alternative processes described herein may be implemented together with, or separately from, other operational methodologies described herein. FIG. 12 depicts the forming of mask 142 on second ILD layer 140 to create first opening 150 in second ILD layer 140. In this case, however, the forming of first opening 150 may be controlled (e.g., through etching time and/or materials) such that at least a portion of barrier film 130 remains intact on first rounded electrode 122. A first portion 130*a* of barrier film 130 may act as an insulative liner between two metal wiring levels, while a second portion 130*b* of barrier film 130 below first opening 150 may serve as a capacitor dielectric film after subsequent processing concludes. Although second portion 130*b* may be of the same vertical thickness as first portion 130*a* in some implementations, second portion 130*b* may be partially recessed in further implementations. The composition of barrier film 130 also may be modified to include one or more high-k dielectric materials described herein, to increase the capacitance of the eventual capacitor.

Figure 14:
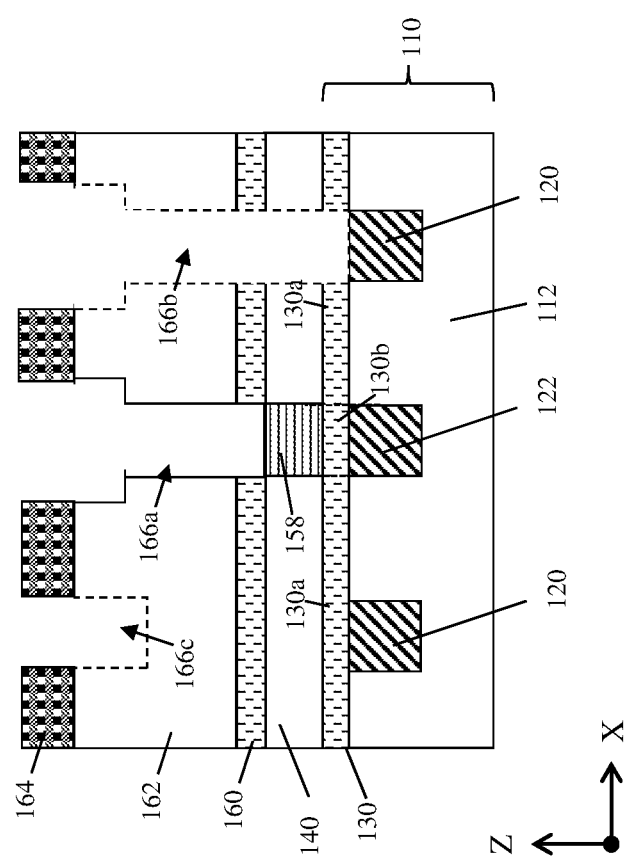
FIG. 14 shows a cross-sectional view of forming a second ILD layer and openings for a second wiring level according to further embodiments of the disclosure.
Figure 15:
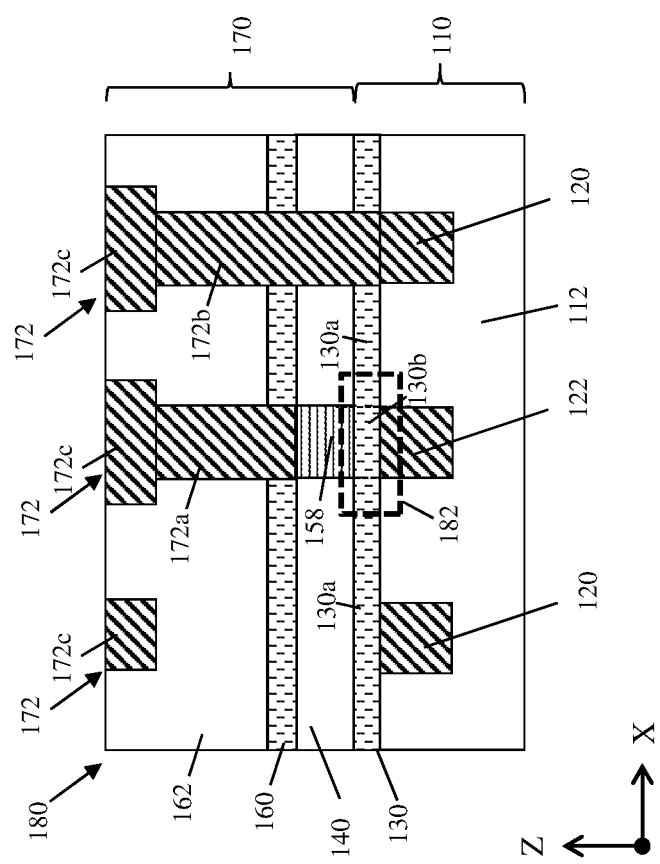
FIG. 15 shows a cross-sectional view of forming wire and via metals within the openings according to further embodiments of the disclosure.

With continued reference to FIGS. 12-15, FIG. 13 depicts filling first opening 150 with conductive material (e.g., tungsten, and/or other electrode materials discussed herein) to form second rounded electrode 158. In this case, dielectric layer 152 (FIGS. 5, 6) is not formed on barrier film 130 and within second ILD layer 140 because second portion 130b of barrier film 130 will act as a capacitor dielectric film in the eventual structure. With second rounded electrode 158 in place, second barrier film 160 and additional portion 162 may be formed over second ILD layer 140, though this is not required in all implementations. FIG. 14 depicts forming mask(s) 164 over additional portion 162 to form second opening(s) 166a, 166b, 166c, where conductive materials will be formed. Similar to other implementations discussed herein, second openings 166b, 166c are illustrated with dashed lines to indicate that they are formed using different mask(s) 164 and/or separately from second opening 166a. FIG. 15, lastly, depicts filling second opening(s) 166a, 166b, 166c with second level conductor(s) 172 such as vias 172a, 172b and wire(s) 172c, in substantially the same manner as other processing methodologies described herein. In this case, via(s) 172b may electrically couple wire(s) 172c to capacitor 182. Additionally, second portion 130b of barrier film 130 may serve as a capacitor dielectric film instead of other materials discussed herein, and can be vertically between first rounded electrode 122 and second rounded electrode 158. Notwithstanding the use of second portions 130b as a capacitor dielectric film, first rounded electrode 122 may be vertically beneath and at least partially vertically aligned with second rounded electrode 158.

Figure 16:
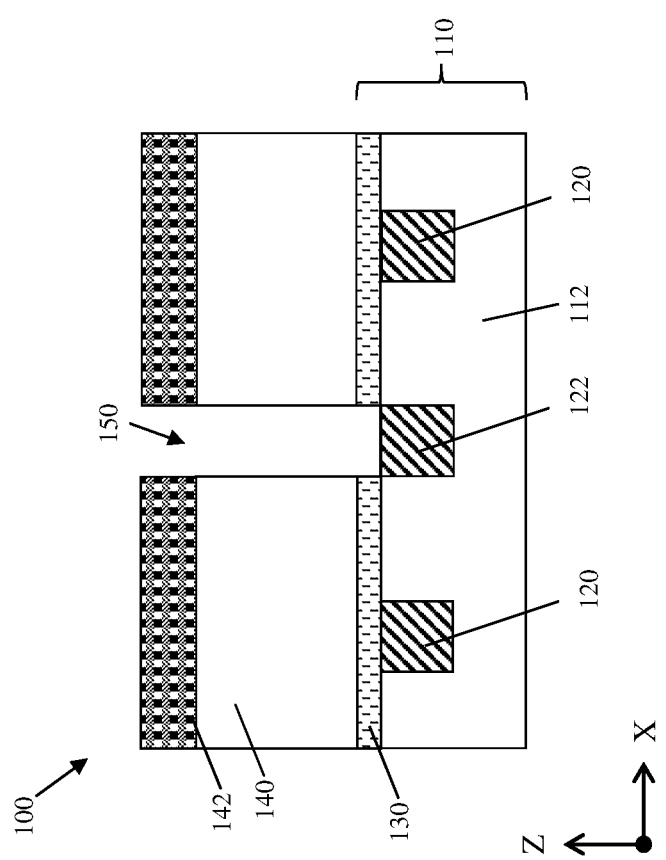
FIG. 16 shows a cross-sectional view of forming a second ILD layer and an electrode opening according to other embodiments of the disclosure.
Figure 17:
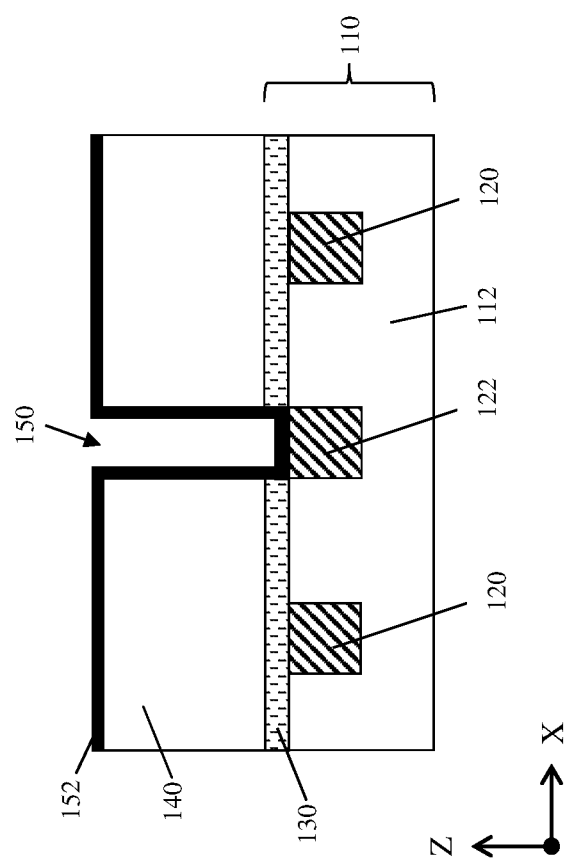
FIG. 17 shows a cross-sectional view of forming a capacitor dielectric film in the electrode opening according to other embodiments of the disclosure.
Figure 18:
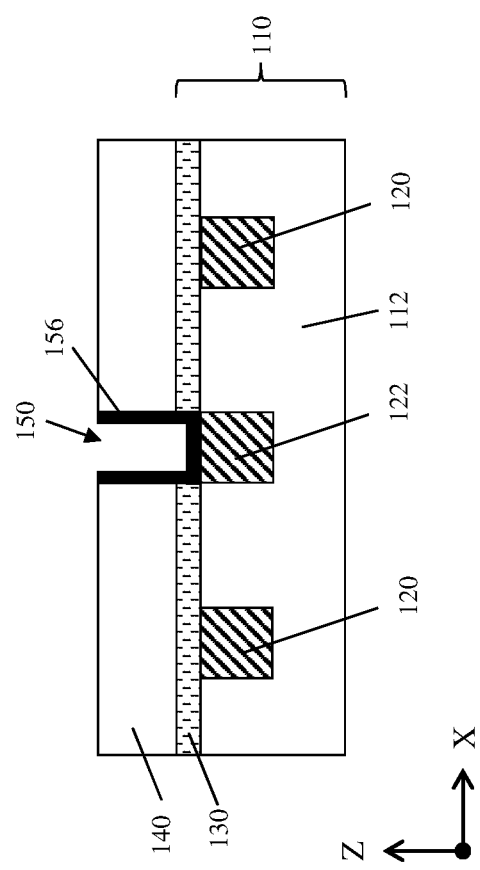
FIG. 18 shows a cross-sectional view of recessing the second ILD and capacitor dielectric film according to other embodiments of the disclosure.
Figure 19:
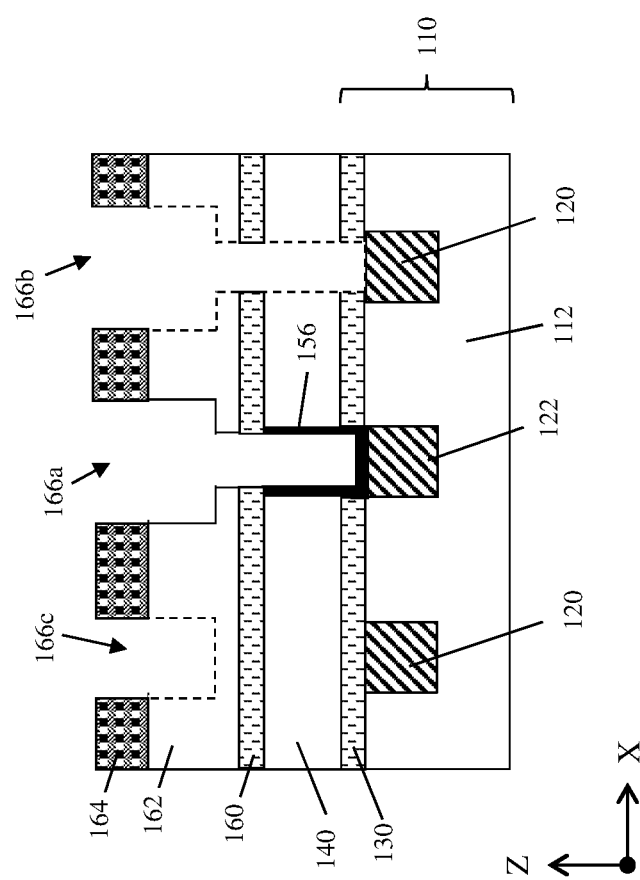
FIG. 19 shows a cross-sectional view of forming additional second ILD material and forming wiring openings in the second ILD material according to other embodiments of the disclosure.

Referring to FIGS. 16-21, still further implementations of the disclosure provide methods to form IC structure 180 in which portions of second level conductor 172 act as a second rounded electrode for the capacitor. FIG. 16 depicts the forming of mask 142 on second ILD layer 140 of preliminary structure 100, to create first opening 150. Here, the forming of first opening 150 includes removing a portion of barrier film 130 to expose first rounded electrode 122 thereunder. FIG. 17 depicts forming dielectric layer 152 in a manner similar to other embodiments, but without the subsequent forming of conductor layer 154 (FIG. 6) therein. Instead, as shown in FIG. 18, second ILD layer 140 and dielectric layer 152 are planarized after dielectric layer 152 is formed, without first forming conductor layer 154. In this case, the planarizing of second ILD layer 140 forms capacitor dielectric film 156 and first opening 150 remains partially vacant and free of electrode material after the planarization of second ILD layer 140 concludes. As shown in FIG. 19, additional barrier film 160 and/or additional portion 162 may be formed in a manner similar to other implementations. In this case, portions of additional barrier film 160 may cover and thus overlie portions of dielectric film 156 thereunder. Mask(s) 164 can then be used to form second opening(s) 166a, 166b, 166c within second ILD layer 140. Similar to other examples described herein, second openings 166b, 166c are shown with phantom lines to indicate that they may be formed with other masks 164 and/or subsequently to the forming of first opening(s) 166a. Second opening 166a, more specifically, may be formed to expose capacitor dielectric film 156.

Figure 20:
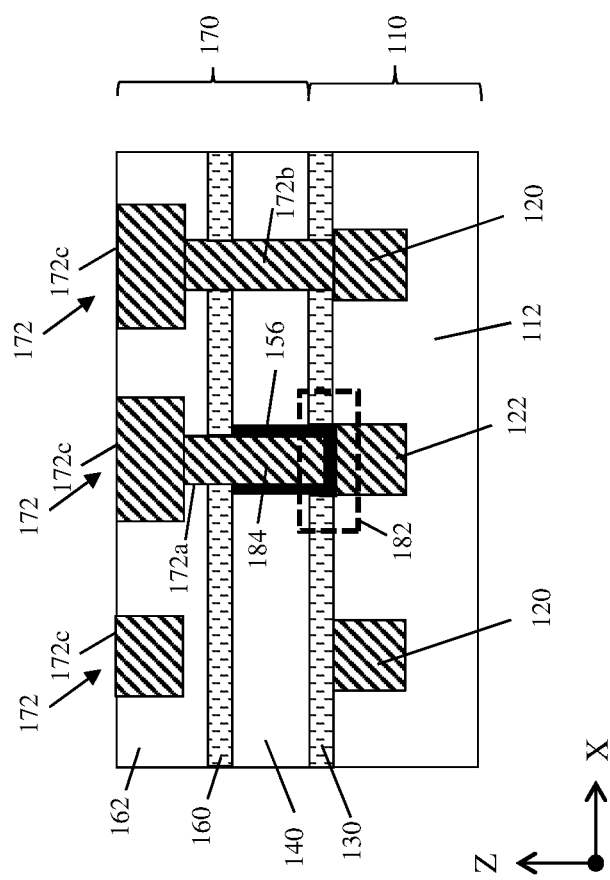
FIG. 20 shows a cross-sectional view of forming metal wires and vias for a second wiring layer according to other embodiments of the disclosure.
Figure 21:
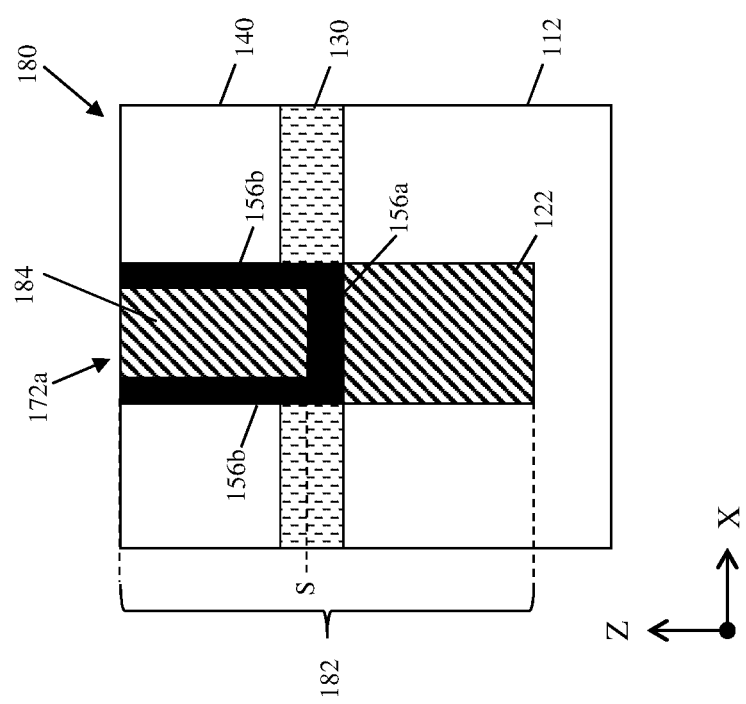
FIG. 21 shows an expanded cross-sectional view of a capacitor structure according to other embodiments of the disclosure.

FIG. 20 depicts the filling of second opening(s) 166a, 166b, 166c with second level conductor(s) 172 to yield via(s) 172a, 172b, and wires 172c. In this case, capacitor dielectric film 156 horizontally surrounds via(s) 172. In addition, a portion of capacitor dielectric film 156 is vertically between first rounded electrode 122 and via(s) 172 thereover. Via 172a may be vertically above, and substantially aligned with, first rounded electrode 122. The portion of via 172a that is vertically above first rounded electrode 122, and adjacent capacitor dielectric film 156, may define a second rounded electrode 184 for capacitor 182. In this case, second rounded electrode 184 may have the same material composition as first rounded electrode 122 (e.g., copper or other conductive metals), rather than being formed of tungsten and/or other materials that are distinct from the composition of first rounded electrode 122. The expanded view of capacitor 182 shown in FIG. 21 illustrates capacitor dielectric film 156 as optionally including first portion 156a vertically between rounded electrodes 122, 184, and second portion 156b circumferentially alongside second circumferential electrode 184. Bottom surface S of second circumferential electrode 186 may be vertically below a lower surface of second ILD layer 140, and thus second circumferential electrode 186 extends partially into first metal wiring level 110. Despite possible differences in the composition and/or forming of second circumferential electrode 184, IC structure 180 and/or capacitor 182 may be similar or identical to other embodiments discussed herein.

Embodiments of the disclosure provide various technical and commercial advantages, some of which are described herein as examples. The components of capacitor 182, including first rounded electrode 122, capacitor dielectric film 156, and second rounded electrode(s) 156, 184, may be formed to a vertical thickness that is determined by deposition characteristics (e.g., deposition time) instead of by etching characteristics. Deposition can be more precisely controlled than other processes to form an IC material. Thus, it is significantly easier for a circuit manufacture to achieve a desired capacitance value with electrodes formed by deposition, as opposed to capacitor electrodes that are formed by several deposition and etching steps. Additionally, capacitor 182 of IC structure 180 may be integrated easily into first metal wiring level 110 and second metal wiring level 170 of IC structure 180, without otherwise interfering with the components and/or processing of metal wiring levels 110, 170. These attributes, in turn, may allow very low capacitances (e.g., approximately 0.5 femtofarads) to be achieved more consistently than other types of capacitors in ICs. The resulting variation in capacitance from design specifications may be, e.g., at most approximately ten percent error from the desired amount of capacitance in capacitor 182. Methods of the disclosure can also be integrated into conventional processes to form metal wiring layers of an IC, without fundamentally changing the operational methodology and/or adding a significant number of additional steps.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a first inter-level dielectric (ILD) layer having a top surface;
    a barrier film on the top surface of the first ILD layer;
    a first vertical electrode within the first ILD layer;
    a capacitor dielectric film on a top surface of the first vertical electrode and at least partially within the barrier layer;
    a second ILD layer over the first ILD layer; and
    a second vertical electrode within the second ILD layer and on the capacitor dielectric film, wherein the capacitor dielectric film is vertically between the first vertical electrode and the second vertical electrode,
    wherein the capacitor dielectric film includes:
        a first portion vertically between the first vertical electrode and the second vertical electrode; and
        a second portion above the first portion, and horizontally between an outer circumference of the second vertical electrode and the second ILD layer.

2. The IC structure of claim 1, wherein a material composition of the first vertical electrode is different from a material composition of the second vertical electrode.

3. The IC structure of claim 2, wherein the first vertical electrode includes copper and the second vertical electrode includes tungsten.

4. The IC structure of claim 1, wherein the capacitor dielectric film includes a hafnium-based dielectric.

5. The IC structure of claim 1, wherein a vertical thickness of the first portion is between approximately five nanometers (nm) and approximately fifteen nm, and a horizontal thickness of the second portion is between approximately five nm and approximately fifteen nm.

6. The IC structure of claim 1, wherein a bottom surface of the second vertical electrode is below a bottom surface of the second ILD layer, and above a top surface of the first ILD layer.

7. The IC structure of claim 1, further comprising a second metal wiring level including a metal wire within the second ILD layer, and coupled to the second vertical electrode.

8. The IC structure of claim 7, wherein the second metal wiring level further includes a via on the second vertical electrode within the second ILD layer, the second via vertically coupling the second vertical electrode to the metal wire.

9. An integrated circuit (IC) structure, comprising:
    a first metal wiring level including:
        a first inter-level dielectric (ILD) layer having a top surface,
        a first rounded electrode within the first ILD layer, and having a top surface substantially coplanar with the top surface of the first ILD layer, and
        a barrier film on the top surface of the first ILD layer of the first metal wiring level, wherein a portion of the barrier film on the top surface of the first rounded electrode defines a capacitor dielectric film; and
    a second metal wiring level including:
        a second ILD layer on a first portion of the barrier film,
        a first via within the second ILD layer, and horizontally distal to the capacitor dielectric film, and
        a second rounded electrode within the second ILD layer and on a second portion of the barrier film, wherein the second rounded electrode is horizontally distal to the first via in the second ILD layer, and the second portion of the barrier film defines a capacitor dielectric region vertically between the first rounded electrode and the second rounded electrode.

10. The IC structure of claim 9, wherein the first rounded electrode includes copper and the second rounded electrode includes tungsten.

11. The IC structure of claim 9, wherein a vertical thickness of the second portion of the barrier film is between approximately five nanometers (nm) and approximately fifteen nm.

12. The IC structure of claim 9, wherein the second metal wiring level further includes:
    a second via within the second ILD layer on the second rounded electrode; and a metal wire within the second ILD layer on the second via, wherein the second via vertically couples the metal wire to the second rounded electrode.

13. The IC structure of claim 9, wherein the barrier film includes a low-k dielectric material.

14. A method of forming an integrated circuit (IC) structure, the method comprising:
    forming a first metal wiring level including a first rounded electrode within a first inter-level dielectric (ILD) layer, wherein a top surface of the first rounded electrode is substantially coplanar with a top surface of the first ILD layer;
    forming a capacitor dielectric film on a top surface of the first rounded electrode;
    forming a second metal wiring level including a second ILD layer over the first ILD layer;
    forming a second rounded electrode within the second ILD layer of the second metal wiring level over the capacitor dielectric film, wherein forming the second rounded electrode causes the capacitor dielectric film to be vertically between the first rounded electrode and the second rounded electrode; and
    forming a via within the second ILD layer of the second metal wiring level, wherein the via is horizontally distal to the capacitor dielectric film and the second rounded electrode.

15. The method of claim 14, wherein the second rounded electrode includes copper and the second rounded electrode includes tungsten.

16. The method of claim 15, wherein the capacitor dielectric film includes a hafnium-based dielectric.

17. The method of claim 14, wherein forming the capacitor dielectric film includes:
    forming a first portion on the top surface of the first rounded electrode; and
    forming a second portion above the first portion on a sidewall of the second ILD layer, wherein forming the second rounded electrode causes the second portion of the capacitor dielectric film to be horizontally between an outer circumference of the second rounded electrode and the second ILD layer.

18. The method of claim 14, further comprising forming a barrier film on the first ILD layer, wherein the barrier film is vertically between the first metal wiring level and the second metal wiring level.

19. The method of claim 18, wherein a portion of the barrier film on the first rounded electrode includes the capacitor dielectric film.

* * * * *